US012690498B2

(12) United States Patent
Jo et al.

(10) Patent No.: US 12,690,498 B2
(45) Date of Patent: Jul. 21, 2026

(54) SEMICONDUCTOR PACKAGE

(71) Applicant: SAMSUNG ELECTRONICS CO., LTD., Suwon-si (KR)

(72) Inventors: Chajea Jo, Suwon-si (KR); Dohyun Kim, Suwon-si (KR); Seungryong Oh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 402 days.

(21) Appl. No.: 18/356,771

(22) Filed: Jul. 21, 2023

(65) Prior Publication Data

US 2024/0162188 A1     May 16, 2024

(30) Foreign Application Priority Data

Nov. 16, 2022     (KR) ........................ 10-2022-0153572

(51) Int. Cl.
  *H10W 90/00*     (2026.01)
  *H10W 20/20*     (2026.01)
  *H10W 74/10*     (2026.01)

(52) U.S. Cl.
  CPC .......... *H10W 90/00* (2026.01); *H10W 74/117* (2026.01); *H10W 20/20* (2026.01); *H10W 90/722* (2026.01); *H10W 90/724* (2026.01); *H10W 90/792* (2026.01)

(58) Field of Classification Search
  CPC . H10W 90/00; H10W 90/722; H10W 90/724; H10W 90/792; H10W 90/291; H10W 90/297; H10W 74/117; H10W 74/111; H10W 20/20; H10W 70/611; H10W 70/65
  See application file for complete search history.

(56) References Cited

U.S. PATENT DOCUMENTS

| | | | |
|---|---|---|---|
| 7,723,835 B2 | 5/2010 | Nakashima et al. | |
| 8,343,804 B2 | 1/2013 | Coteus et al. | |
| 9,214,441 B2 | 12/2015 | Kwon et al. | |
| 9,589,945 B2 * | 3/2017 | Jo .......................... | H10W 20/20 |
| 10,262,989 B2 | 4/2019 | Chen et al. | |
| 10,312,219 B2 | 6/2019 | Ng et al. | |
| 2013/0082399 A1 | 4/2013 | Kim et al. | |
| 2014/0131858 A1 | 5/2014 | Pan et al. | |
| 2019/0131203 A1 * | 5/2019 | Kang .................... | H10W 40/22 |
| 2022/0093582 A1 | 3/2022 | Kim | |

* cited by examiner

*Primary Examiner* — Steven B Gauthier
*Assistant Examiner* — Marc-Anthony Armand
(74) *Attorney, Agent, or Firm* — Wolf, Greenfield & Sacks, P.C.

(57)     ABSTRACT

A semiconductor package includes a substrate; a first chip structure on the substrate and having a first thickness in a first direction; a second chip structure on the substrate adjacent to the first chip structure along a second direction and having a second thickness in the first direction; a third chip structure on the substrate and adjacent to the first chip structure and the second chip structure in a third direction perpendicular to the second direction; and an encapsulant covering the first chip structure, the second chip structure, and the third chip structure, wherein the third chip structure includes a lower chip structure that overlaps a first portion of a space between the first chip structure and the second chip structure in the third direction, and an upper chip structure on the lower chip structure such that a second portion of the space is exposed in the third direction.

20 Claims, 11 Drawing Sheets

I-I'

CS3_2

Y  Z  X

LCS(200A)  200B1  200B2  200B3
UCS

CS3_3

H2

H1

Y  Z  X

LCS(200A)  200B2  200B1  200B3
UCS

II-II'

CS3 { UCS1
      UCS2
      LCS

SEMICONDUCTOR PACKAGE

CROSS-REFERENCE TO RELATED APPLICATION(S)

This application claims benefit of and priority to Korean Patent Application No. 10-2022-0153572 filed on Nov. 16, 2022 in the Korean Intellectual Property Office, the disclosure of which is incorporated herein by reference in its entirety.

BACKGROUND

Example embodiments of the present disclosure relate to semiconductor packages.

A semiconductor package provided for high performance computing (HPC) may include a plurality of semiconductor chips. A plurality of semiconductor chips may be mounted adjacent to each other on the same substrate and may be interconnected through wiring of the substrate. A narrow space between the plurality of semiconductor chips may, however, cause warpage and voids in an encapsulant.

SUMMARY

An example embodiment of the present disclosure is to provide a semiconductor package having improved yield.

According to an example embodiment of the present disclosure, a semiconductor package includes a substrate; a first chip structure on the substrate and having a first thickness in a first direction; a second chip structure on the substrate in adjacent spaced apart relationship with the first chip structure along a first horizontal direction and having a second thickness in the first direction; a third chip structure on the substrate in adjacent spaced apart relationship with the first chip structure and the second chip structure along a third direction that is perpendicular to the second direction; and an encapsulant covering at least a portion of each of the first chip structure, the second chip structure, and the third chip structure, wherein the third chip structure includes a lower chip having a third thickness in the first direction that is smaller than the first thickness of the first chip structure and the second thickness of the second chip structure, wherein the lower chip structure overlaps a first portion of a space between the first chip structure and the second chip structure in the third direction, and an upper chip structure on the lower chip structure, wherein the upper chip structure has a fourth thickness in the first direction that is greater than the third thickness of the lower chip structure, and wherein the upper chip structure is configured such that a second portion of the space between the first chip structure and the second chip structure is exposed in the third direction.

According to an example embodiment of the present disclosure, a semiconductor package includes a substrate including a wiring circuit; first and second chip structures on the substrate in adjacent spaced apart relationship along a first direction and electrically connected to the wiring circuit; a third chip structure on the substrate in adjacent spaced apart relationship with the first chip structure and the second chip structure along a second direction perpendicular to the first direction and electrically connected to the wiring circuit; an encapsulant covering at least a portion of each of the first chip structure, the second chip structure, and the third chip structure; and connection bumps below the substrate and electrically connected to the wiring circuit, wherein the third chip structure includes a lower chip structure that overlaps both the first chip structure and the second chip structure in the second direction, and an upper chip structure on the lower chip structure, wherein the upper chip structure overlaps only one of the first chip structure and the second chip structure in the second direction.

According to an example embodiment of the present disclosure, a semiconductor package includes a substrate; a first chip structure on the substrate and having a first side surface spaced apart from one side of the substrate by a first distance; a second chip structure on the substrate in adjacent spaced apart relationship with the first chip structure along a first direction, wherein the second chip structure includes a second side surface that opposes the first side surface of the first chip structure, and wherein the second side surface is spaced apart from the one side of the substrate by a second distance that is greater than the first distance; a third chip structure on the substrate in adjacent spaced apart relationship with the first chip structure and the second chip structure along a second direction perpendicular to the first direction, wherein the third chip structure has a third side surface including a lower side surface spaced apart from the one side of the substrate by a third distance less than or equal to the first distance, and an upper side surface spaced apart from the one side of the substrate by a fourth distance greater than or equal to the second distance; and an encapsulant covering at least a portion of each of the first chip structure, the second chip structure, and the third chip structure.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described as follows with reference to the accompanying drawings.

Figure 1A:
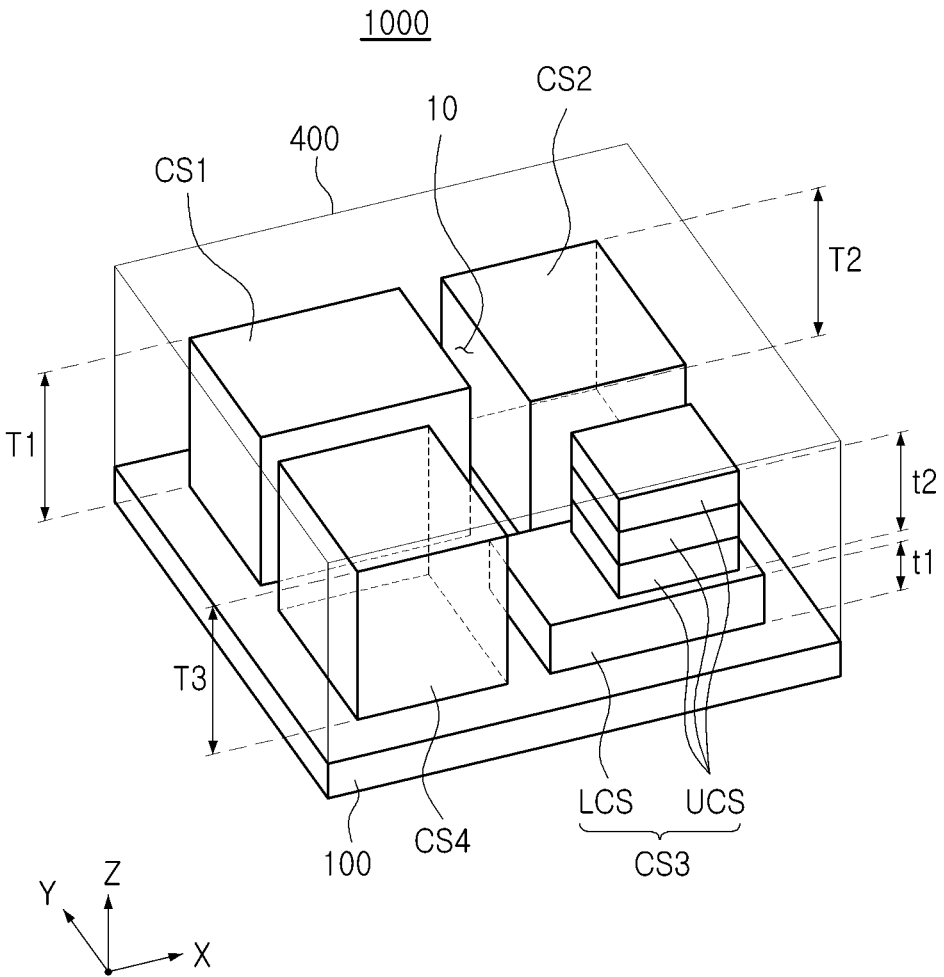
FIG. 1A is a perspective diagram illustrating a semiconductor package according to an example embodiment of the present disclosure.
Figure 1B:
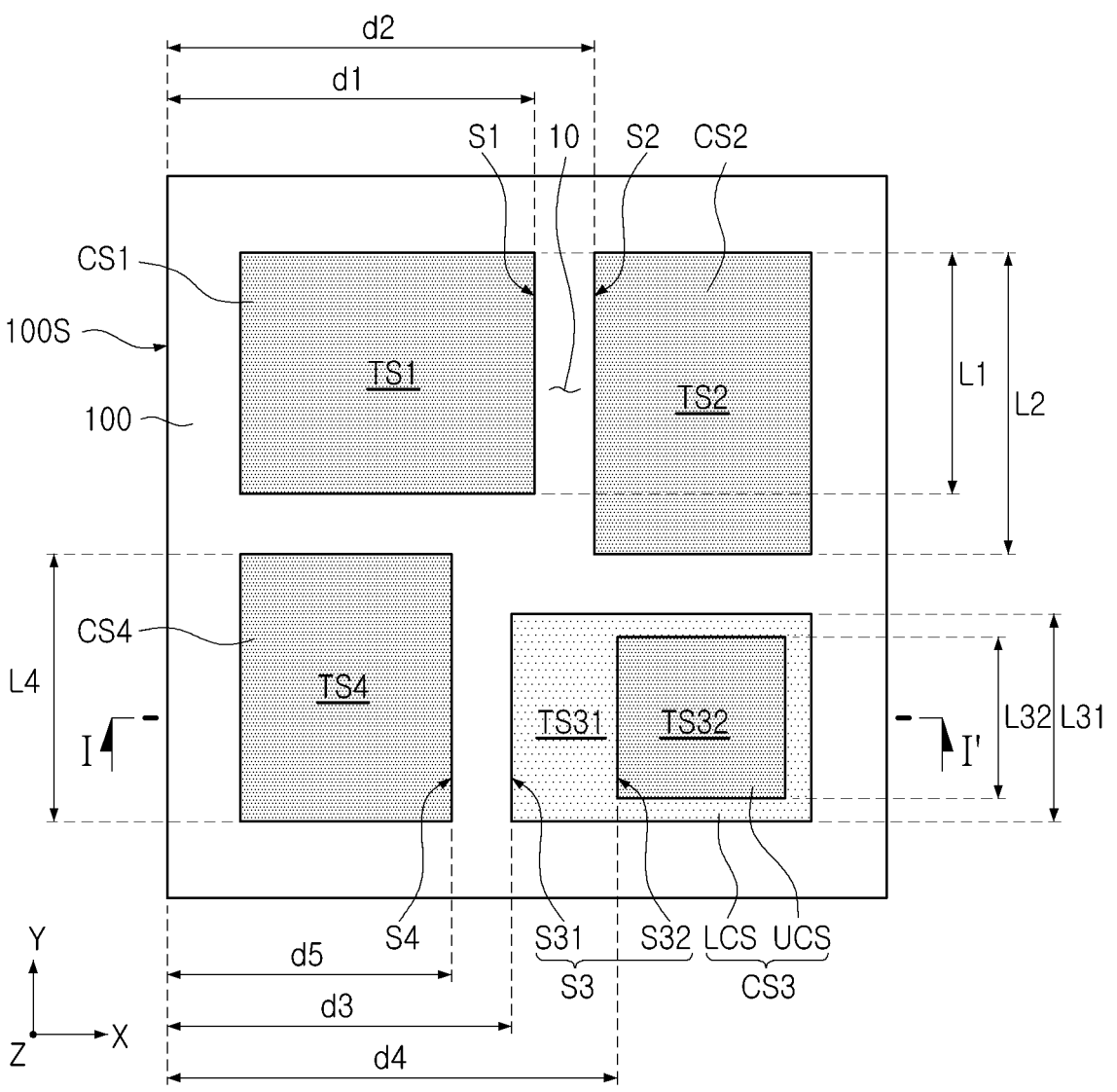
FIG. 1B is a plan diagram illustrating the semiconductor package in FIG. 1A according to an example embodiment of the present disclosure.
Figure 1C:
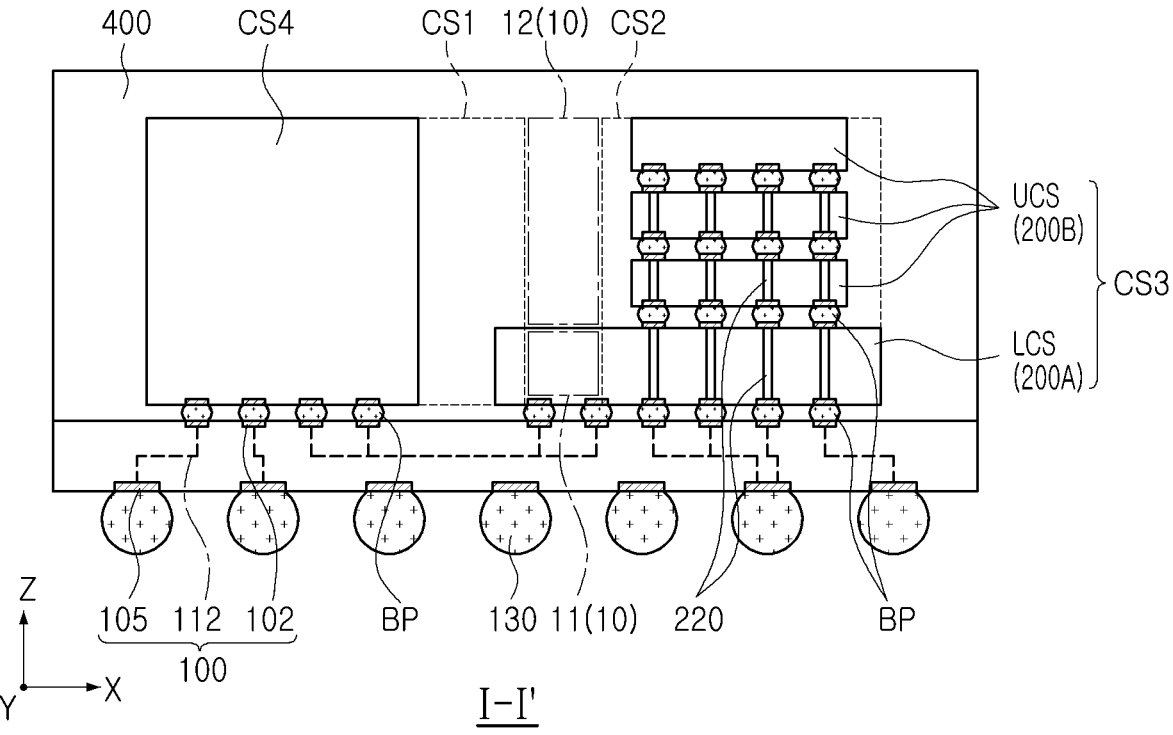
FIG. 1C is a cross-sectional diagram taken along line I-I' in FIG. 1B.
Figure 1D:
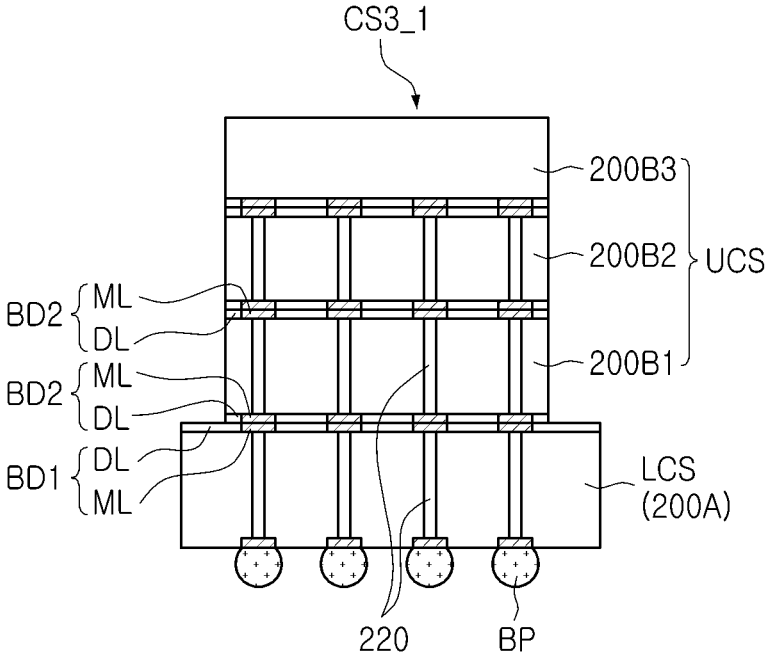
FIG. 1D is a cross-sectional diagram of a modified example of a third chip structure.

FIG. 1A is a perspective diagram illustrating a semiconductor package 1000 according to an example embodiment. FIG. 1B is a plan diagram illustrating the semiconductor package 1000 in FIG. 1A according to an example embodiment. FIG. 1C is a cross-sectional diagram taken along line I-I' in FIG. 1B. FIG. 1D is a cross-sectional diagram of a modified example of a third chip structure CS3.

Referring to FIGS. 1A to 1C, a semiconductor package 1000 according to an example embodiment may include a substrate 100, a first chip structure CS1, a second chip structure CS2, a third chip structure CS3, and an encapsulant 400. In example embodiments, the semiconductor package 1000 may further include a fourth chip structure CS4.

In the example embodiment, by disposing a third chip structure CS3 including a lower chip structure LCS and an upper chip structure UCS on one side of the first chip structure CS1 and the second chip structure CS2 disposed adjacently to each other in a predetermined shape, warpage concentrated in the space 10 between the first chip structure CS1 and the second chip structure CS2 may be reduced, and voids between chip structures (CS1, CS2, CS3) formed during the process of filling the encapsulant 400 may be prevented.

For example, the third chip structure CS3 may include the lower chip structure LCS and the upper chip structure UCS having different thicknesses (or heights). The lower chip structure LCS may have a third thickness t1 smaller than the first thickness T1 of the first chip structure CS1 and the second thickness T2 of the second chip structure CS2 in the vertical direction (Z-direction), and may overlap the first portion (11 in FIG. 1C) of the space between the first chip structure CS1 and the second chip structure CS1 in the horizontal direction (e.g., Y-direction). In other words, when viewed along the Y direction, as shown in FIG. 1C, the lower chip structure LCS extends across a line of sight of the space 10 between the first chip structure CS1 and the second chip structure CS2 and blocks the view of a portion (i.e., the first portion 11) of the space 10. The upper chip structure UCS may have a fourth thickness t2 greater than the third thickness t1 of the lower chip structure LCS in the vertical direction (Z-direction), and may be disposed on the lower chip structure LCS such that second portion (12 in FIG. 1C) of the space 10 between the first chip structure CS1 and the second chip structure CS2 is exposed in the horizontal direction (e.g., Y-direction). In other words, when viewed along the Y direction, as shown in FIG. 1C, the portion of the space 10 between the first chip structure CS1 and the second chip structure CS2 that is above the top surface of the lower chip structure LCS can be seen (i.e., is not blocked in view by either the lower chip structure LCS or the upper chip structure UCS of the third chip structure CS3.

For example, as illustrated in FIG. 1B, the third chip structure CS3 may have a third side surface S3 including a lower side surface S31 spaced apart from one side 100S of the substrate 100 by a distance d3 equal to or smaller than the first side surface S1 of the first chip structure CS1, and an upper side surface S32 spaced apart from one side 100S of the substrate 100 by a distance d4 equal to or greater than the second side surface S2 of the second chip structure CS2.

For example, as illustrated in FIG. 1C, the lower chip structure LCS may overlap both the first chip structure CS1 and the second chip structure CS2 in one direction (e.g., Y-direction), and the upper chip structure UCS may overlap only one of the first chip structure CS1 and the second chip structure CS2 (e.g., the second chip structure CS2) in one direction (e.g., Y-direction). In other words, when viewed along the Y direction, as shown in FIG. 1C, the lower chip structure LCS blocks the view of a portion of the first chip structure CS1 and blocks the view of a portion of the second chip structure CS2, and the upper chip structure UCS blocks the view of a portion of the second chip structure CS2.

Hereinafter, each component of the semiconductor package 1000 will be described in greater detail.

The substrate 100 may be implemented as a support substrate on which chip structures CS1, CS2, CS3, and CS4 are mounted, and may include a printed circuit substrate (PCB), a ceramic substrate, a glass substrate, a tape wiring substrate, and the like. For example, the substrate 100 may be implemented as a silicon interposer substrate including through silicon vias (TSVs).

The substrate 100 may include upper pads 102, lower pads 105, and a wiring circuit 112 electrically connecting the pads to each other. The upper pads 102 may be disposed on the upper surface of the substrate 100, and the lower pads 105 may be disposed on the lower surface of the substrate 100. The wiring circuit 112 may electrically connect the chip structures CS1, CS2, CS3, and CS4 to each other.

The upper pads 102, the lower pads 105, and the wiring circuit 112 may include at least one metal from among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn) and carbon (C) or alloys formed of two or more metals.

Connection bumps 130 may be disposed below the substrate 100. The connection bumps 130 may be electrically connected to the chip structures CS1, CS2, CS3, and CS4 through the wiring circuit 112. The connection bumps 130 may include, for example, tin (Sn) or an alloy (e.g., Sn—Ag—Cu) including tin (Sn). The connection bumps 130 may be electrically connected to external devices such as a module substrate and a system board.

The first chip structure CS1 and the second chip structure CS2 may be disposed adjacently to each other on the substrate 100, with a space 10 therebetween. For example, the first chip structure CS1 and the second chip structure CS2 may be disposed on the substrate 100 to oppose each other in a first direction (e.g., X-direction), and may be electrically connected to each other by the wiring circuit 112 of the substrate 100. A first side surface S1 of the first chip structure CS1 opposes a second side surface S2 of the second chip structure CS2, as illustrated in FIG. 1B. The first chip structure CS1 and the second chip structure CS2 may have a thickness greater than that of the lower chip structure LCS of the third chip structure CS3. The first chip structure CS1 may have a first thickness T1 in the vertical direction (Z-direction), and the second chip structure CS2 may have a second thickness T2 in the vertical direction (Z-direction). The first thickness T1 and the second thickness T2 may be equal to each other, but an example embodiment, thereof is not limited thereto. The first chip structure CS1 may have the first side surface S1 spaced apart from one side 100S of the substrate 100 by a first distance d1 and opposing the second chip structure CS2, as illustrated in FIG. 1B. The second chip structure CS2 may have the second side surface S2 spaced apart from one side 100S of the substrate 100 by a second distance d2 and opposing the first chip structure CS1, as illustrated in FIG. 1B. In an example embodiment, the first side surface S1 and the second side surface S2 may have different lengths. For example, the first length L1 of the first side surface S1 in the second direction (e.g., the Y-direction) may be smaller than the second length L3 of the second side surface S2, as illustrated in FIG. 1B. In example embodiments, the first side surface S1 and the second side surface S2 may have the same lengths L1 and L2 (the example embodiment in FIG. 3A).

The first chip structure CS1 and the second chip structure CS2 may include a bare chip or a packaged chip. The first chip structure CS1 and the second chip structure CS2 may include, for example, a logic chip such as a central processor (CPU), a graphics processor (GPU), a field programmable gate array (FPGA), a digital signal processor (DSP), a cryptographic processor, a microprocessor, a microcontroller, an analog-to-digital converter, an application specific integrated circuits (ASIC), or a volatile memory device such as dynamic RAM (DRAM) and static RAM (SRAM), a non-volatile memory device such as phase change RAM (PRAM), magnetic RAM (MRAM), resistive RAM (RRAM), and flash memory device, or a high-performance memory device such as high bandwidth memory (HBM), or hybrid memory cubic (HMC).

The third chip structure CS3 may be disposed on the substrate 100 and may be electrically connected to the first chip structure CS1 and the second chip structure CS2 through the wiring circuit 112. The third chip structure CS3 may be disposed adjacently to the first chip structure CS1 and the second chip structure CS2 (i.e., the third chip structure CS3 is in adjacent spaced apart relationship with the first chip structure CS1 and the second chip structure CS2, as illustrated in FIG. 1B. For example, the third chip structure CS3 may be adjacent to the first chip structure CS1 and the second chip structure CS2 in a second direction (Y-direction) perpendicular to the first direction (X-direction) in which the first chip structure CS1 and the second chip structure CS2 are disposed. The chip structures CS1, CS2, C3, and C4 may be disposed to have substantially the same spacing distance therebetween. For example, the spacing distance between the first chip structure CS1 and the second chip structure CS2 in the first direction (X-direction) may be substantially the same as at least one of a spacing distance between the lower chip structure LCS of the third chip structure CS3 and the first chip structure CS1 in the second direction (Y-direction) and a spacing distance between the lower chip structure LCS and the second chip structure CS2 in the second direction (Y-direction). A spacing distance between the chip structures CS1, CS2, C3, and C4 may be about 10 μm or more, but an example embodiment, thereof is not limited thereto.

The third chip structure CS3 may include a lower chip structure LCS and an upper chip structure UCS disposed to partially overlap the space 10 between the first chip structure CS1 and the second chip structure CS2. Accordingly, warpage and voids concentrated between the first chip structure CS1 and the second chip structure CS2 may be prevented. For example, the warpage concentrated in the space 10 between the first chip structure CS1 and the second chip structure CS2 may be suppressed by the lower chip structure LCS supplementing a rigidity in an extending direction of the space 10. For example, the voids may be reduced by the upper chip structure UCS arranged to secure a flow space of the encapsulant 400 above the lower chip structure LCS.

The lower chip structure LCS may overlap both the first chip structure CS1 and the second chip structure CS2 in one direction (e.g., Y-direction), and the upper chip structure UCS may overlap only one of the first chip structure CS1 and the second chip structure CS2 in one direction (e.g., Y-direction). For example, the upper chip structure UCS may overlap only the second chip structure CS2 in the second direction (Y-direction). The upper chip structure UCS may not overlap the space 10 between the first chip structure CS1 and the second chip structure CS2 in the second direction (Y-direction), such that fluidity of the encapsulant 400 may improve, voids in a narrow space between the chip structures CS1, CS2, CS3, and CS4, for example, between the first chip structure CS1 and the second chip structure CS2 may be reduced, and yield may improve. In other words, the offset of the upper chip structure UCS of the third chip structure CS3 relative to the lower chip structure LCS of the third chip structure CS3 facilitates relatively unimpeded flow of the encapsulant between the chip structures CS1, CS2, CS3, and CS4. This unimpeded flow helps prevent voids from forming in the encapsulant.

The lower chip structure LCS may define the lower side surface S31 of the third chip structure CS3, and the upper chip structure UCS may define the upper side surface S32 of the third chip structure CS3. The lower side surface S31 may be spaced apart from one side 100S of the substrate 100 by a third distance d3 equal to or smaller than the first distance d1. The upper side surface S32 may be spaced apart from one side 100S of the substrate 100 by a fourth distance d4 greater than or equal to the second distance d2. The lower chip structure LCS may overlap the space 10 between the first chip structure CS1 and the second chip structure CS2 in the second direction (Y-direction), such that warpage concentrated between the first chip structure CS1 and the second chip structure CS2 may be prevented.

In example embodiments, the lower side surface S31 and the upper side surface S32 may have different lengths in the second direction (Y-direction). For example, the length of the upper side surface S32 in the second direction (Y-direction) may be smaller than the length of the lower side surface S31, but an example embodiment, thereof is not limited thereto.

The height (hereinafter, referred to as "third thickness t1") of the lower side surface S31 of the third chip structure CS3 may be smaller than thicknesses T1 and T2 of the first chip structure CS1 and the second chip structure CS2. The height of the upper side surface S32 of the third chip structure CS3 (hereinafter, referred to as "fourth thickness t2") may be greater than the height of the lower side surface S31 (hereinafter, referred to as "third thickness t1"). The upper surface TS31 of the lower chip structure LCS may be disposed on a level lower than a level of the upper surface TS1 of the first chip structure CS1, the upper surface TS2 of the second chip structure CS2, the upper surface TS32 of the upper chip structure UCS and/or the upper surface TS4 of the fourth chip structure CS4, as illustrated in FIG. 1A. In an example embodiment, the upper surface TS1 of the first chip structure CS1, the upper surface TS2 of the second chip structure CS2, the upper surface TS32 of the upper chip structure UCS, and/or the upper surface TS4 of the fourth chip structure CS4 may be on substantially the same level. In example embodiments, the upper surface TS1 of the first chip structure CS1, the upper surface TS2 of the second chip structure CS2, and the upper surface TS32 of the upper chip structure UCS may be exposed from the encapsulant 400, but an example embodiment, thereof is not limited thereto.

The lower chip structure LCS may have a third thickness t1 smaller than the first thickness T1 of the first chip structure CS1 and the second thickness T2 of the second chip structure CS2 in the vertical direction (Z-direction), and may overlap the first portion (11 in FIG. 1C) of the space between the first chip structure CS1 and the second chip structure CS1 in the horizontal direction (e.g., Y-direction).

In other words, when viewed along the Y direction, as shown in FIGS. 1A and 1C, the lower chip structure LCS extends across a line of sight of the space 10 between the first chip structure CS1 and the second chip structure CS2. The upper chip structure UCS may have a fourth thickness t2 greater than the third thickness t1 of the lower chip structure LCS in the vertical direction (Z-direction), and may be disposed on the lower chip structure LCS such that the second portion (12 in FIG. 1C) of the space 10 between the first chip structure CS1 and the second chip structure CS2 is exposed in the horizontal direction (e.g., Y-direction). An area of the second portion 12 of the space 10 between the first and second chip structures CS1 and CS2 in the second direction (Y-direction) may be greater than that of the first portion 11. In other words, a volume of the second portion 12 of the space 10 is greater than a volume of the first portion 11 of the space 10. Therefore, voids between the first chip structure CS1 and the second chip structure CS2 may be reduced and yield may improve.

In example embodiments, the sum of the third thickness t1 and the second thickness t2 may be substantially equal to the first thickness T1 and the second thickness T2, but an example embodiment, thereof is not limited thereto. Here, the "thickness" of the chip structures CS1, CS2, CS3, and CS4 may be defined as a height including the semiconductor chip and the bumps BP therebelow.

Each of the lower chip structure LCS and the upper chip structure UCS may include at least one semiconductor chip. For example, the lower chip structure LCS may include the first semiconductor chip 200A, and the upper chip structure UCS may include a plurality of second semiconductor chips 200B. The first semiconductor chip 200A and the plurality of second semiconductor chips 200B may be electrically connected to each other through the through electrodes 220 and the bumps BP (see FIG. 1C).

The first semiconductor chip 200A and the plurality of second semiconductor chips 200B may be configured as chiplets included in a multi-chip module (MCM). For example, the first semiconductor chip 200A and the plurality of second semiconductor chips 200B may include a memory chip including a central processor (CPU), a graphics processor (GPU), a field programmable gate array (FPGA), a digital signal processor (DSP), a cryptographic processor, a microprocessor, a microcontroller, an analog-to-digital converter, an application specific integrated circuits (ASIC), an I/O chip, or a volatile memory (e.g. DRAM), or a non-volatile memory (e.g. ROM and flash memory). For example, the lower chip structure LCS may include a processor circuit, and the upper chip structure UCS may include at least one of an input/output circuit for the processor circuit, an analog circuit, a memory circuit, and serial-parallel converter circuits.

In example embodiments, the semiconductor chips 200A and 200B may be directly bonded and coupled to each other without a connecting member (e.g., a solder bump or a copper post). As illustrated in FIG. 1D, the third chip structure CS3_1 of the modified example may include semiconductor chips 200A, 200B1, 200B2, and 200B3 formed by metal bonding by metal pads ML bonded to each other and dielectric bonding by insulating layers DL bonded to each other. For example, the lower chip structure LCS and the upper chip structure UCS may be physically and electrically coupled to each other by a first bonding layer BD1 and a second bonding layer BD2 including metal pads ML and insulating layers DL. The second semiconductor chips 200B1 and 200B2 other than the first semiconductor chip 200A and the uppermost second semiconductor chip 200B3 may include a through electrode 220 for electrical connection.

The first semiconductor chip 200A and the plurality of second semiconductor chips 200B may have different planar areas. For example, the lower chip structure LCS may include a first semiconductor chip 200A having a first planar area, and the upper chip structure UCS may include a plurality of second semiconductor chips 200B each having a second planar area smaller than the first planar area. In example embodiments, the plurality of second semiconductor chips 200B may have different planar areas (the example embodiment in FIG. 2A). The plurality of second semiconductor chips 200B may be stacked in a vertical direction (Z-direction) on the first semiconductor chip 200A. In example embodiments, at least a portion of the plurality of second semiconductor chips 200B may be stacked in a horizontal direction (X or Y-direction) on the first semiconductor chip 200A (the example embodiment in FIG. 2B).

The encapsulant 400 may encapsulate (i.e., surround or cover) at least a portion of each of the first chip structure CS1, the second chip structure CS2, and the third chip structure CS3 on the substrate 100. In an example embodiment, the upper chip structure UCS may be disposed so as not to overlap the space 10 between the first chip structure CS1 and the second chip structure CS2, such that voids formed between the chip structures CS1, CS2, and CS3 in the process of filling the encapsulant 400 may be reduced and yield may improve. Accordingly, the encapsulant 400 may be in direct contact with at least portion of the side surfaces of the first chip structure CS1, the second chip structure CS2, and the third chip structure CS3, and the upper surface TS32 of the lower chip structure LCS. The encapsulant 400 may include, for example, a thermosetting resin such as epoxy resin, a thermoplastic resin such as polyimide, or a prepreg impregnated with an inorganic filler in the above-mentioned resins, Ajinomoto build-up film (ABF), FR-4, bismaleimide-triazine (BT), and epoxy molding compound (EMC).

The semiconductor package 1000 may further include a fourth chip structure CS4 adjacent to the third chip structure CS3. Similarly to the first chip structure CS1 and the second chip structure CS2, the fourth chip structure CS4 may include a bare chip or a packaged chip. The fourth chip structure CS4 may be electrically connected to the other chip structures CS1, CS2, and CS3 through the wiring circuit 112 of the substrate 100. The fourth chip structure CS4 may be electrically connected to the wiring circuit 112 of the substrate 100 through the bumps BP.

The fourth chip structure CS4 may be disposed on the substrate 100 to be adjacent to the third chip structure CS3 in the first direction (X-direction). For example, the fourth chip structure CS4 may be disposed between one side 100S of the substrate 100 and the third chip structure CS3. The fourth chip structure CS4 may be spaced apart from one side 100S of the substrate 100 by a fifth distance d5 smaller than the third distance d3, and may have a fourth side surface S4 opposing the third side surface S3, as illustrated in FIG. 1B. The fourth chip structure CS4 may have a fourth thickness T3 substantially the same as that of the first chip structure CS1 and the second chip structure CS2, but an example embodiment, thereof is not limited thereto. The upper surface TS4 of the fourth chip structure CS4 may be disposed on substantially the same level as a level of the upper surface TS1 of the first chip structure CS1, the upper surface TS2 of the second chip structure CS2, and the upper surface TS32 of the upper chip structure UCS.

In an example embodiment, the fourth side surface S4 of the fourth chip structure CS4 may have a length L4 different from the lower side surface S31 and the upper side surface S32 of the third chip structure CS3 in the second direction (Y-direction). In this case, the fourth chip structure CS4 may overlap both the second chip structure CS2 and the third chip structure CS3 in the first direction (X-direction), and may overlap only one of the first chip structure CS1 and the second chip structure CS2 in the second direction (Y-direction). That is, the fourth chip structure CS4 may overlap the space between the second chip structure CS2 and the third chip structure CS3 in the first direction (X-direction), thereby preventing warpage concentrated between the second chip structure CS2 and the third chip structure CS3. In other words, when viewed along the X direction, the fourth chip structure CS4 extends across a line of sight of the space between the second chip structure CS2 and the third chip structure CS3.

Hereinafter, the stacked form of the third chip structure CS3 will be described with reference to FIGS. 2A and 2B.

Figure 2A:
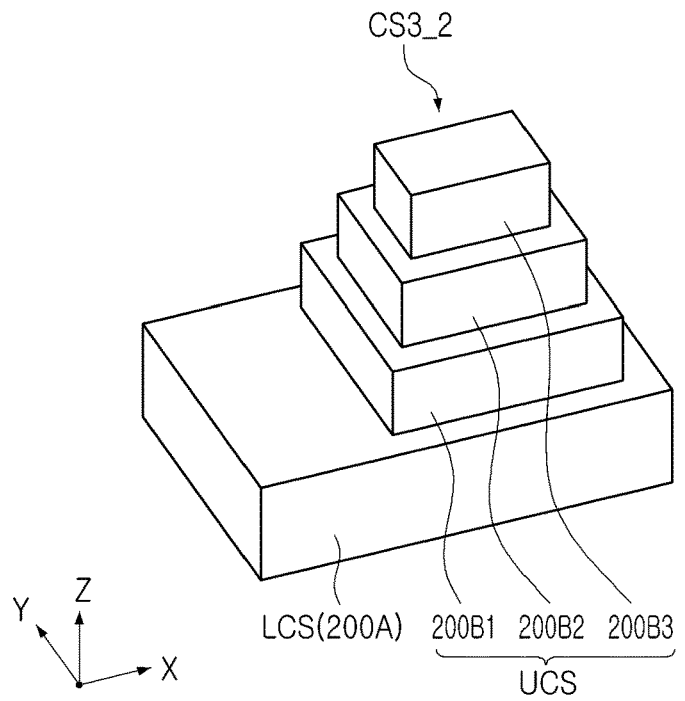
FIG. 2A is a perspective diagram illustrating a modified example of a third chip structure.

FIG. 2A is a perspective diagram illustrating a modified example of a third chip structure CS3_2. FIG. 2B is a perspective diagram illustrating a modified example of a third chip structure CS3_3.

Referring to FIG. 2A, the third chip structure CS3_2 of the modified example may include an upper chip structure UCS including second semiconductor chips 200B1, 200B2, and 200B3 in different planar areas. The second semiconductor chips 200B1, 200B2, and 200B3 may be stacked on the first semiconductor chip 100A in a staircase shape. The second semiconductor chips 200B1, 200B2, and 200B3 may include at least one of an input/output circuit for the first semiconductor chip 200A, an analog circuit, a memory circuit, and serial-parallel converter circuits.

Figure 2B:
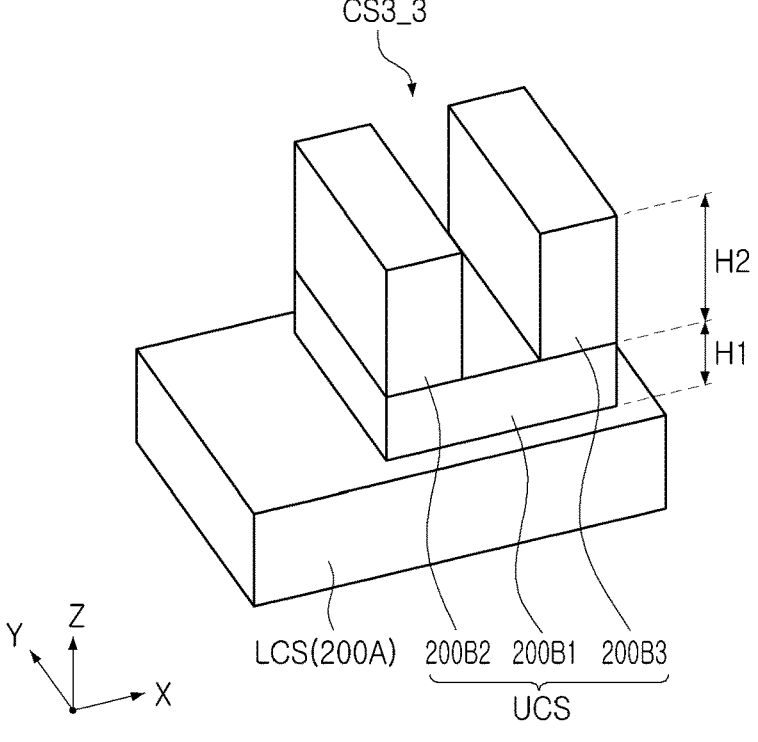
FIG. 2B is a perspective diagram illustrating a modified example of a third chip structure.

Referring to FIG. 2B, the third chip structure CS3_3 of the modified example may include upper second semiconductor chips 200B2 and 200B3 disposed in a horizontal direction. For example, the upper second semiconductor chips 200B2 and 200B3 may be spaced apart from each other in the first direction (X-direction) on the lower second semiconductor chip 200B1. In modified examples, the thickness H2 of the upper second semiconductor chips 200B2 and 200B3 may be greater than the thickness H1 of the lower second semiconductor chip 200B1.

The size, shape, and number of the plurality of second semiconductor chips 200B1, 200B2, and 200B3 included in the upper chip structure UCS are not limited to illustrated example in FIGS. 1A to 2B and may be varied.

Figure 3A:
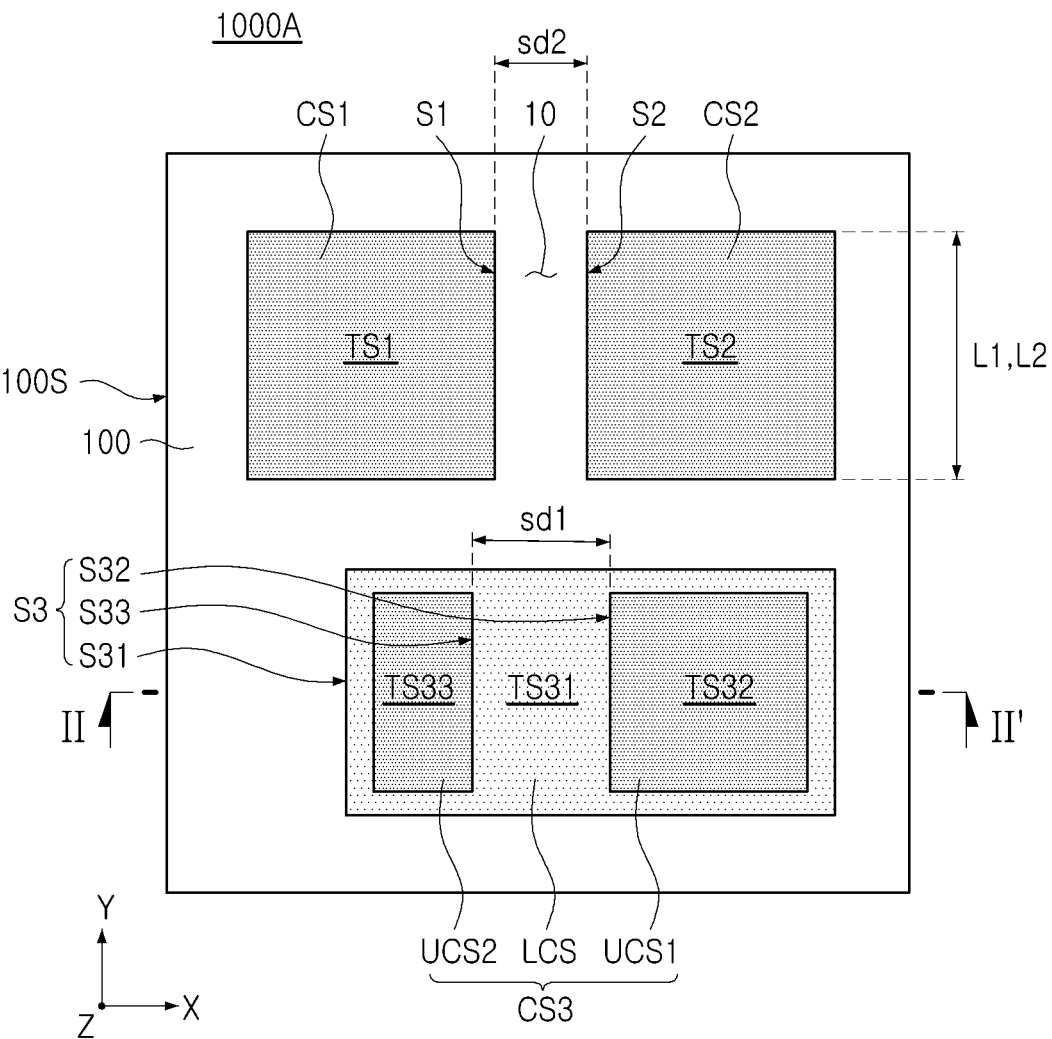
FIG. 3A is a plan diagram illustrating a semiconductor package according to an example embodiment of the present disclosure.
Figure 3B:
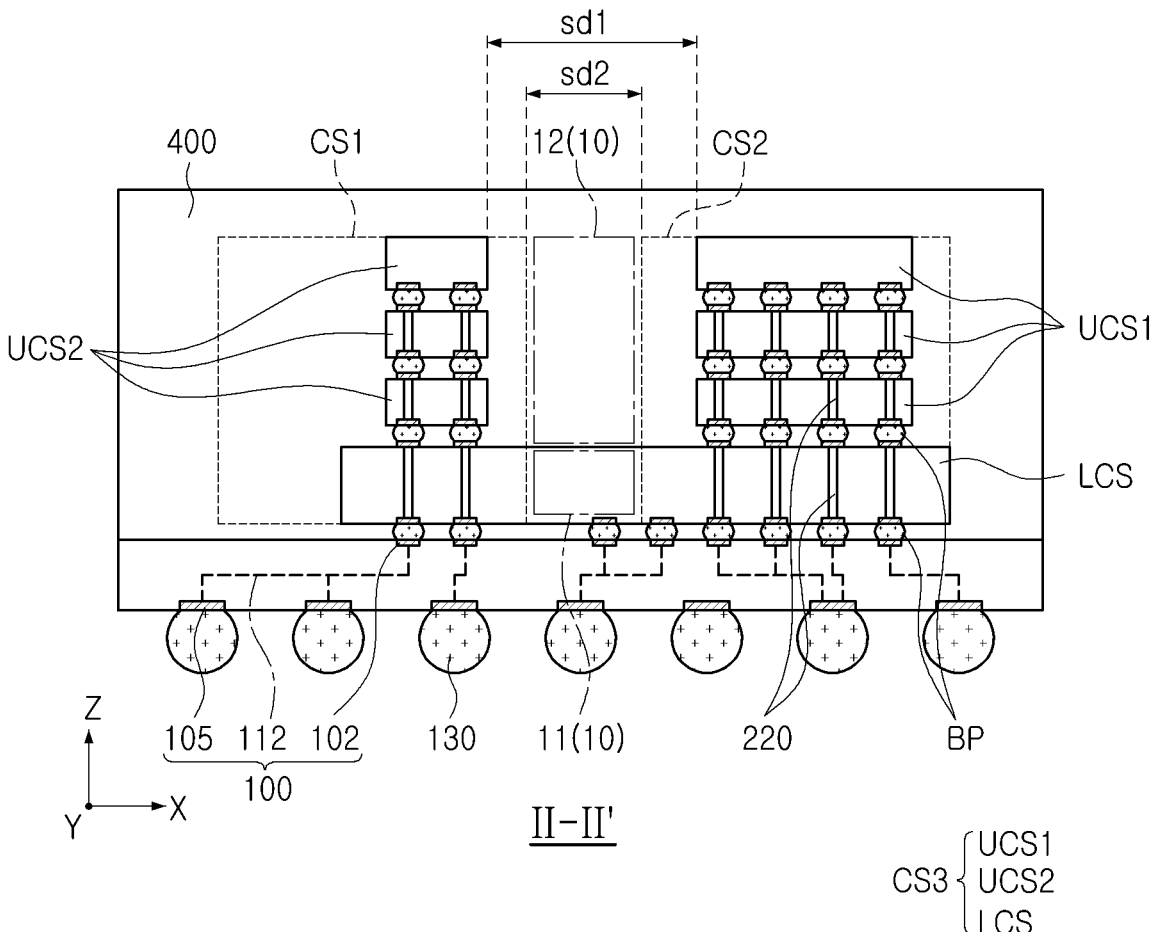
FIG. 3B is a cross-sectional diagram taken along line II-II' in FIG. 3A.

FIG. 3A is a plan diagram illustrating a semiconductor package 1000A, according to an example embodiment. FIG. 3B is a cross-sectional diagram taken along line II-II' in FIG. 3A.

Referring to FIGS. 3A to 3B, a semiconductor package 1000A according to an example embodiment may be configured the same as or similarly to the example described with reference to FIGS. 1A to 2B other than the configuration in which a plurality of upper chip structures UCS1 and UCS2 may be included. As illustrated in FIG. 3A, the first chip structure CS1 and the second chip structure CS2 may have the same size. For example, the first side surface S1 of the first chip structure CS1 and the second side surface S2 of the second chip structure CS2 may have the same lengths L1 and L2, but an example embodiment thereof is not limited thereto.

The third chip structure CS3 in the example embodiment may include a lower chip structure LCS, a first upper chip structure UCS1, and a second upper chip structure UCS2.

The first upper chip structure UCS1 and the second upper chip structure UCS2 may be spaced apart from each other in a first direction (X-direction) on the lower chip structure LCS. The spacing distance sd1 between the first upper chip structure UCS1 and the second upper chip structure UCS2 may be equal to or greater than the spacing distance sd2 between the first chip structure CS1 and the second chip structure CS2. The upper surface TS32 of the first upper chip structure UCS1 and the upper surface TS33 of the second upper chip structure UCS2 may be disposed on the same level as a level of the upper surface TS1 of the first chip structure CS1 and the upper surface TS2 of the second chip structure CS2.

The first upper chip structure UCS1 may overlap only the second chip structure CS2 in the second direction (Y-direction). In other words, when viewed along the Y direction, the first upper chip structure UCS1 blocks only a view of a portion of the second chip structure CS2. The first upper chip structure UCS1 may not overlap the space 10 between the first chip structure CS1 and the second chip structure CS2 in the second direction (Y-direction), such that fluidity of the encapsulant 400 may improve, voids between the narrow spaces between the chip structures CS1, CS2, and CS3, for example, between the first chip structure CS1 and the second chip structure CS2, may be reduced, and yield may improve. In other words, when viewed along the Y direction, the first upper chip structure UCS1 does not block a view of the space 10 between the first chip structure CS1 and the second chip structure CS2. The first upper chip structure UCS1 may have a first upper side surface S32 spaced apart from one side 100S of the substrate 100 by a distance greater than or equal to the second side surface S2 of the second chip structure CS2.

The second upper chip structure UCS2 may overlap only the first chip structure CS1 in the second direction (Y-direction). In other words, when viewed along the Y direction, the second upper chip structure UCS2 blocks only a view of a portion of the first chip structure CS1. The second upper chip structure UCS2 may not overlap the space 10 between the first chip structure CS1 and the second chip structure CS2 in the second direction (Y-direction), such that fluidity of the encapsulant 400 may improve, voids between the narrow spaces between the chip structures CS1, CS2, and CS3, for example, between the first chip structure CS1 and the second chip structure CS2, may be reduced, and yield may improve. In other words, when viewed along the Y direction, the second upper chip structure UCS2 does not block a view of the space 10 between the first chip structure CS1 and the second chip structure CS2. The second upper chip structure UCS2 may have a second upper side surface S33 spaced apart from one side 100S of the substrate 100 by a distance equal to or smaller than the first side surface S1 of the first chip structure CS1.

Figure 4A:
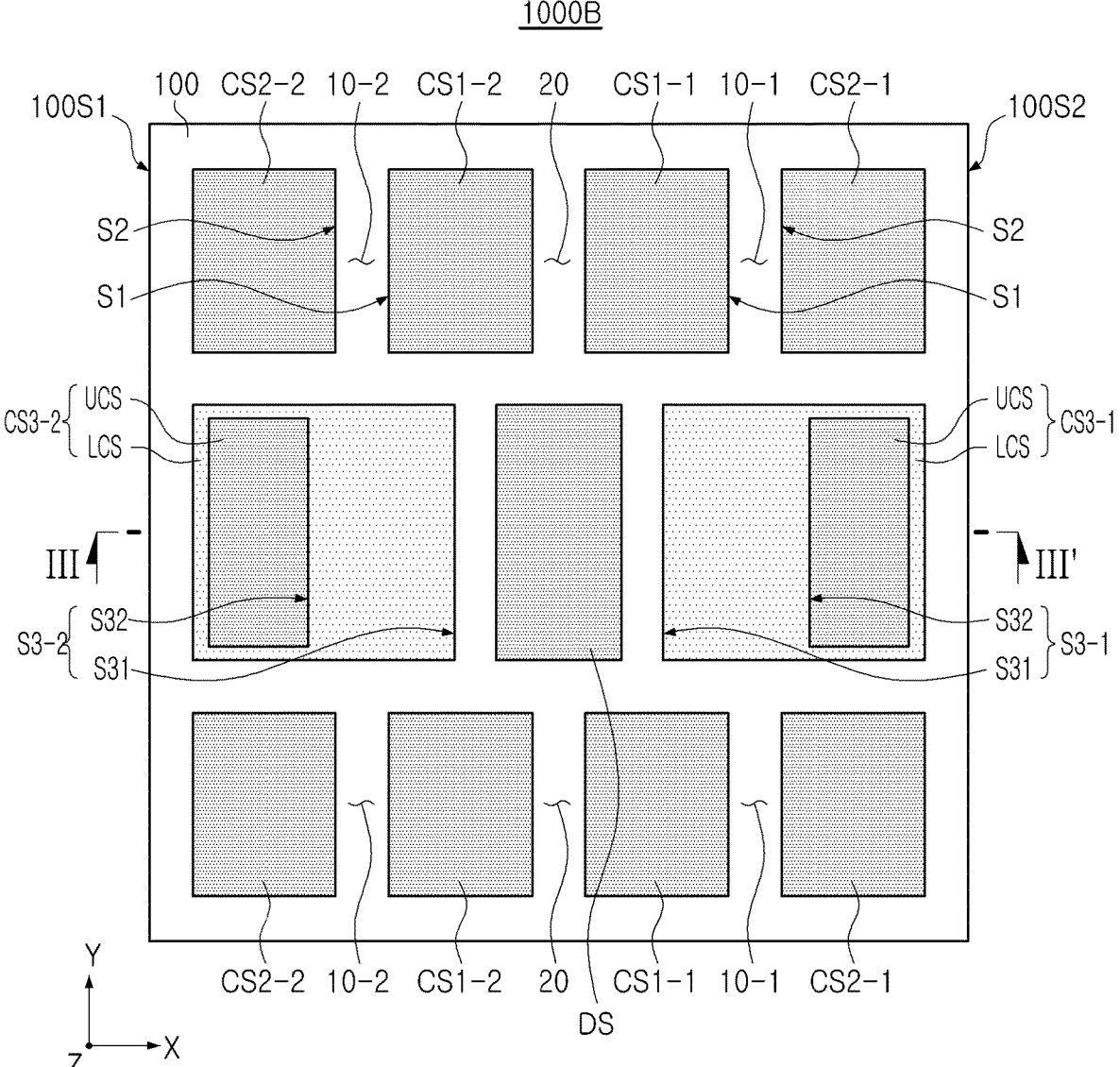
FIG. 4A is a plan diagram illustrating a semiconductor package according to an example embodiment of the present disclosure.
Figure 4B:
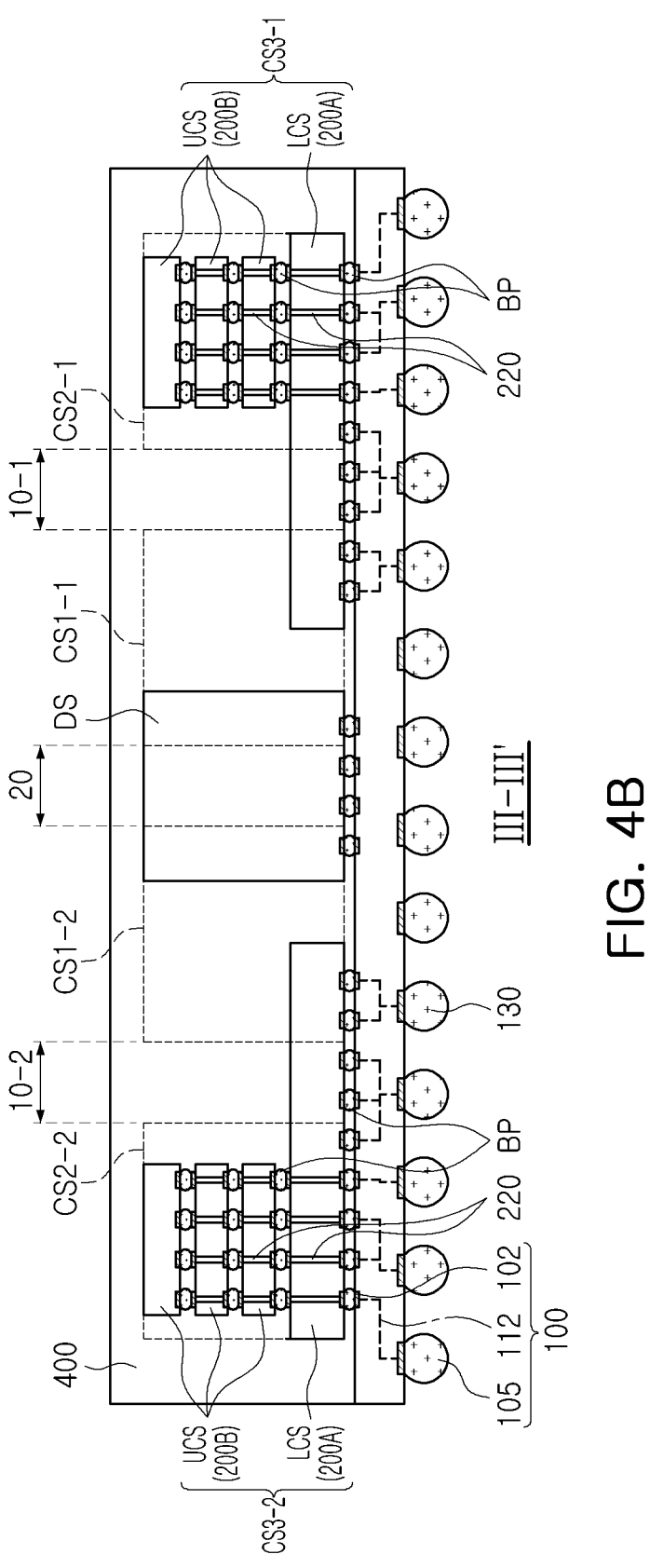
FIG. 4B is a cross-sectional diagram taken along line III-III' in FIG. 4A.

FIG. 4A is a plan diagram illustrating a semiconductor package 1000B according to an example embodiment. FIG. 4B is a cross-sectional diagram taken along line in FIG. 4A.

Referring to FIGS. 4A to 4B, the semiconductor package 1000B in an example embodiment may be configured the same as or similarly to the example described with reference to FIGS. 1A to 3B other than the configuration in which a larger number of chip structures CS1-1, CS1-2, CS2-1, CS2-2, CS3-1, and CS3-2 may be included.

The semiconductor package 1000B in the example embodiment may include a first group of chip structures CS1-1, CS2-1, and CS3-1 and a second group of chip structures CS1-2, CS2-2, and CS3-2. The first group of chip structures CS1-1, CS2-1, and CS3-1 and the second group of chip structures CS1-2, CS2-2, and CS3-2 may include the first chip structures CS1-1 and CS1-2, the second chip structures CS2-1 and CS2-2, and the third chip structures CS3-1 and CS3-2. The first chip structures CS1-1 and CS1-2 and the second chip structures CS2-1 and CS2-2 may be disposed on both sides of the corresponding third chip structures CS3-1 and CS3-2.

The third chip structure CS3-1 of the first group may include a lower chip structure overlapping the space 10-1 between the first chip structure CS1-1 of the first group and the second chip structure CS2-1 of the first group in the horizontal direction (e.g., Y-direction), and an upper chip structure UCS not overlapping the space 10-1 between the first chip structure CS1-1 of the first group and the second chip structure CS2-1 of the first group in the horizontal direction (e.g., Y-direction). In other words, when viewed along the Y direction, the lower chip structure LCS of the third chip structure CS3-1 blocks a view of a portion of the space 10-1 between the first chip structure CS1-1 and the second chip structure CS2-1, and the upper chip structure UCS of the third chip structure CS3-1 does not block a view of the space 10-1 between the first chip structure CS1-1 and the second chip structure CS2-1. The third chip structure CS3-1 of the first group may include a lower side surface S31 spaced apart from the first one side 100S1 of the substrate 100 by a distance equal to or smaller than the first side surface S1 of the first group, and a third side surface of the first group including an upper side surface S32 spaced apart from the first one side 100S1 of the substrate 100 by a distance equal to or greater than the second side surface S2 of the first group.

The third chip structure CS3-2 of the second group may include a lower chip structure LCS overlapping the space 10-2 between the first chip structure CS1-2 of the second group and the second chip structure CS2-2 of the second group in the horizontal direction (e.g., Y-direction), and an upper chip structure UCS not overlapping the space 10-2 between the first chip structure CS1-2 of the second group and the second chip structure CS2-2 of the second group. In other words, when viewed along the Y direction, the lower chip structure LCS of the third chip structure CS3-2 blocks a view of a portion of the space 10-2 between the first chip structure CS1-2 and the second chip structure CS2-2, and the upper chip structure UCS of the third chip structure CS3-2 does not block a view of the space 10-2 between the first chip structure CS1-2 and the second chip structure CS2-2. The third chip structure CS3-2 of the second group may include a third side surface of the second group including a lower side surface S31 spaced apart from the second one side 100S2 of the substrate 100 by a distance equal to or smaller than the first side surface S1 of the second group, and an upper side surface S32 spaced apart from the second one side 100S2 of the substrate 100 by a distance equal to or greater than the second side surface S2 of the second group.

In example embodiments, the semiconductor package 1000B may further include a dummy structure DS. The dummy structure DS may be disposed to overlap the space between the adjacent chip structures CS1-1, CS1-2, CS2-1, CS2-2, CS3-1, and CS3-2, thereby preventing warpage of the substrate 100. For example, the dummy structure DS may be disposed to be adjacent to the third chip structure CS3-1 of the first group and the third chip structure CS3-2 of the second group in the first direction (X-direction), and to overlap the space 20 between the first chip structure CS1-1 of the first group and the first chip structure CS1-2 of the second group in two directions (Y-direction). The dummy structure DS may have substantially the same thickness as those of the other chip structures CS1-1, CS1-2, CS2-1, CS2-2, CS3-1, and CS3-2.

Figure 5A:
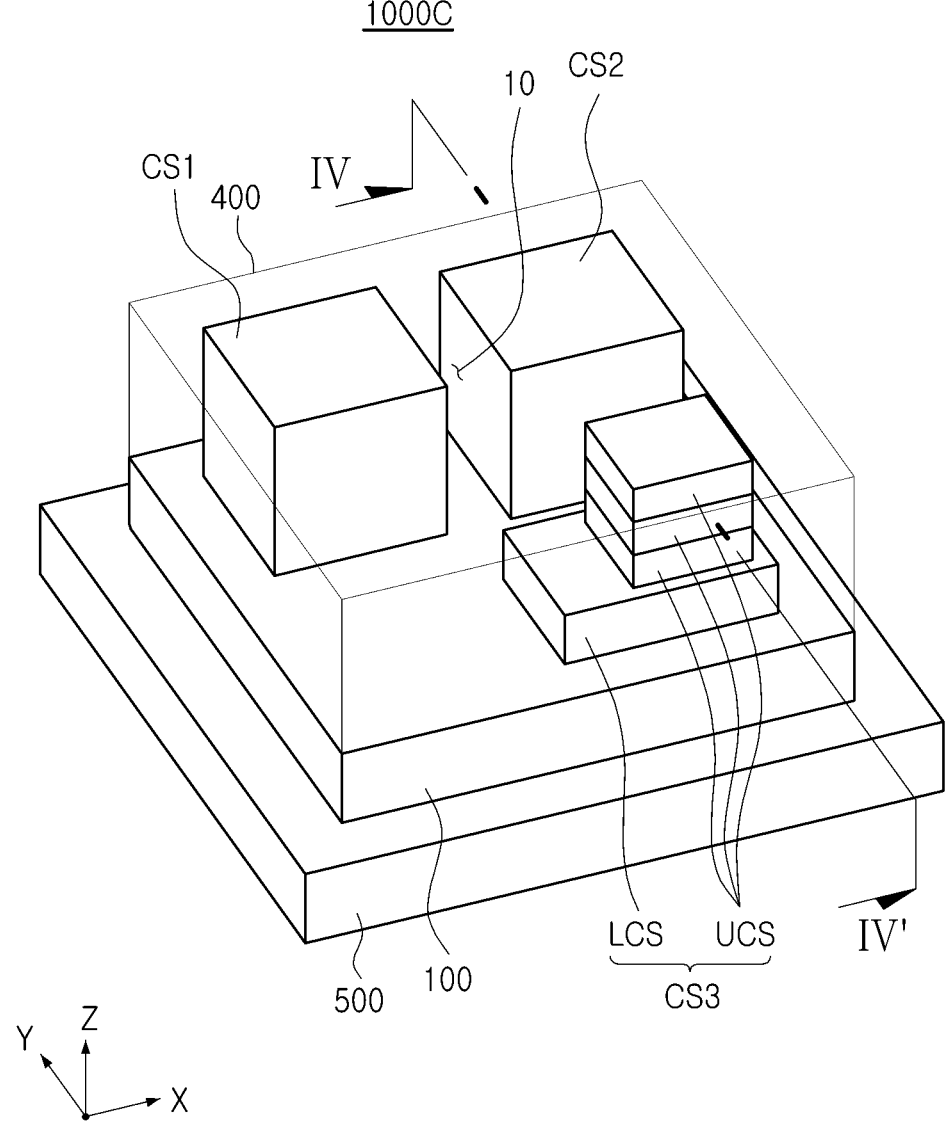
FIG. 5A is a perspective diagram illustrating a semiconductor package according to an example embodiment of the present disclosure.
Figure 5B:
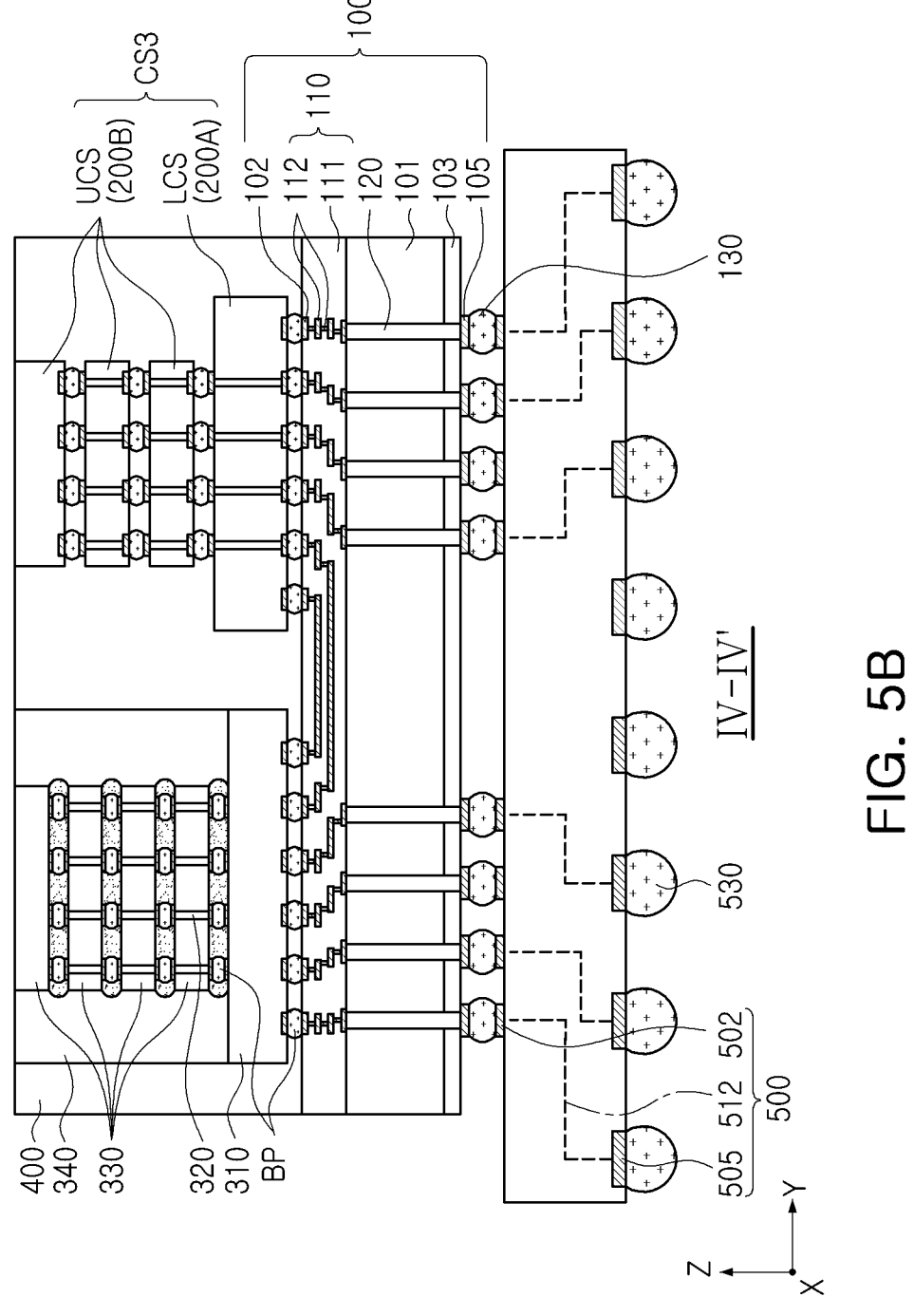
FIG. 5B is a cross-sectional diagram taken along line IV-IV' in FIG. 4A.

FIG. 5A is a perspective diagram illustrating a semiconductor package according to an example embodiment. FIG. 5B is a cross-sectional diagram taken along line IV-IV' in FIG. 4A.

Referring to FIGS. 5A and 5B, the semiconductor package 1000C in an example embodiment may be configured similarly to the example described with reference to FIGS. 1A to 4B other than the configuration in which the base substrate 500 disposed on the lower surface of the substrate 100 and electrically connected to the substrate 100 may be further included. In an example embodiment, the upper surface of the first chip structure CS1, the upper surface of the second chip structure CS2, and the upper surface of the upper chip structure UCS may be disposed on the same plane and may be exposed from the encapsulant 400, but an example embodiment thereof is not limited thereto.

In the example embodiment, the substrate 100 is illustrated as a silicon interposer substrate including a through silicon via (TSV), but an example of a substrate (100 in FIGS. 1A to 4B) is not limited thereto. Also, in the example embodiment, the first chip structure CS1 and the second chip structure CS2 are illustrated as a memory device (e.g., HBM) in which a plurality of memory chips are stacked, but examples of the first chip structure CS1 and the second chip structures CS2 are not limited thereto.

The base substrate 500 may include a lower terminal 505, an upper terminal 502, and a redistribution circuit 512. The base substrate 500 may be configured as a support substrate on which a substrate 100 and chip structures CS1, CS2, and CS3 are mounted, and may be configured as a substrate for semiconductor packaging including a printed circuit substrate (PCB), a ceramic substrate, a glass substrate, a tape wiring substrate, and the like. For example, when the base substrate 500 is a printed circuit substrate, wiring layers may be additionally stacked on one surface or both surfaces of the body copper-clad laminate or copper-clad laminate. A solder resist layer may be formed on the lower and upper surfaces of the base substrate 500, respectively. The redistribution circuit 512 may form an electrical path connecting the lower surface and the upper surface of the base substrate 500. The lower terminal 505, the upper terminal 502, and the redistribution circuit 512 may include at least one metal from among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn) and carbon (C) or alloys formed of two or more metals. The redistribution circuit 512 may include multiple redistribution layers and vias connecting the layers. A connection member 530 connected to the lower terminal 505 may be disposed on the lower surface of the base substrate 500. The connecting member 530 may include tin (Sn), indium (In), bismuth (Bi), antimony (Sb), copper (Cu), silver (Ag), zinc (Zn), lead (Pb), and/or alloys thereof. For example, the connecting member 530 may have a spherical shape or a ball shape including an alloy including tin (e.g., Sn—Ag—Cu).

The substrate 100 may include a semiconductor substrate 101, a circuit layer 110, and through vias 120. A lower pad 105 in contact with the connection bump 130 may be disposed below the substrate 100, and an upper pad 102 may be disposed above the substrate 100. The upper pad 102 and the lower pad 105 may include, for example, at least one of aluminum (Al), copper (Cu), nickel (Ni), tungsten (W), platinum (Pt), and gold (Au), but an example embodiment thereof is not limited thereto.

The semiconductor substrate 101 may include semiconductor elements such as silicon and germanium, or a compound semiconductor such as silicon carbide (SiC), gallium arsenide (GaAs), indium arsenide (InAs), and indium phosphide (InP). A protective layer 103 may be formed below the semiconductor substrate 101. The protective layer 103 may be formed of an insulating layer such as a silicon oxide layer, a silicon nitride layer, or a silicon oxynitride layer. However, the material of the protective layer 103 is not limited to the above materials. For example, the protective layer 103 may be formed of a polymer such as polyimide (PI). Also, although not illustrated, a protective layer may be formed on the circuit layer 110.

The circuit layer 110 may be disposed on the semiconductor substrate 101, and may include an interlayer insulating layer 111, and a wiring circuit 112 including a multilayer pattern layer and contact vias. The interlayer insulating layer 111 may include silicon oxide or silicon nitride. The wiring circuit 112 may interconnect the chip structures CS1, CS2, and CS3 to each other or may connect the chip structures to the through via 120.

The through via 120 may be configured as a through silicon via (TSV) penetrating the semiconductor substrate 101 in a vertical direction (Z-direction). The through via 120 may provide an electrical path connecting the lower pad 105 to the upper pads 102 of the substrate 100. The through via 120 may include a conductive plug and a barrier layer surrounding the conductive plug. The conductive plug may include a metal material such as tungsten (W), titanium (Ti), aluminum (Al), or copper (Cu). The conductive plug may be formed through a plating process, a PVD process, or a CVD process. The barrier film may include an insulating barrier film and/or a conductive barrier film. The insulating barrier film may be formed of an oxide film, a nitride film, a carbide film, a polymer, or a combination thereof. The conductive barrier layer may include, for example, a metal compound such as tungsten nitride (WN), titanium nitride (TiN), or tantalum nitride (TaN). The barrier film may be formed by a PVD process or a CVD process.

The first chip structure CS1 and the second chip structure CS2 may include a base chip 310 and a plurality of semiconductor chips 330. The number of the plurality of semiconductor chips 330 stacked on the base chip 310 is not limited to the example illustrated in the drawing, and for example, three or less or five or more semiconductor chips 330 may be stacked on the base chip 310. The base chip 310 may be formed based on a semiconductor material such as a silicon (Si) wafer and may include a TSV penetrating the body. However, an example embodiment thereof is not limited thereto, and the base chip 310 may be a PCB or a glass substrate not including a semiconductor material. The base chip 310 may be configured as a buffer die for receiving at least one of a control signal, a power signal, or a ground signal for operation of the plurality of semiconductor chips 330 from an external entity, receiving a data signal to be stored in the plurality of semiconductor chips 330 from an external entity, or providing data stored in the plurality of semiconductor chips 330 to an external entity.

The plurality of semiconductor chips 330 may be stacked on the base chip 310 in a vertical direction (Z-direction) and may be connected to each other through a TSV 320 penetrating a portion of the semiconductor chips 330. The plurality of semiconductor chips 330 may include a volatile memory device such as DRAM and static RAM (SRAM), and a non-volatile memory device such as PRAM, MRAM, RRAM, and flash memory devices. The plurality of semiconductor chips 330 may store or output data based on a signal of the base chip 310. A conductive bump and an insulating film surrounding the conductive bump may be disposed between the plurality of semiconductor chips 330. Also, the plurality of semiconductor chips may be surrounded by the molding member 340. The molding member 340 may include an insulating resin such as prepreg, ABF, FR-4, BT, or EMC.

Figure 6:
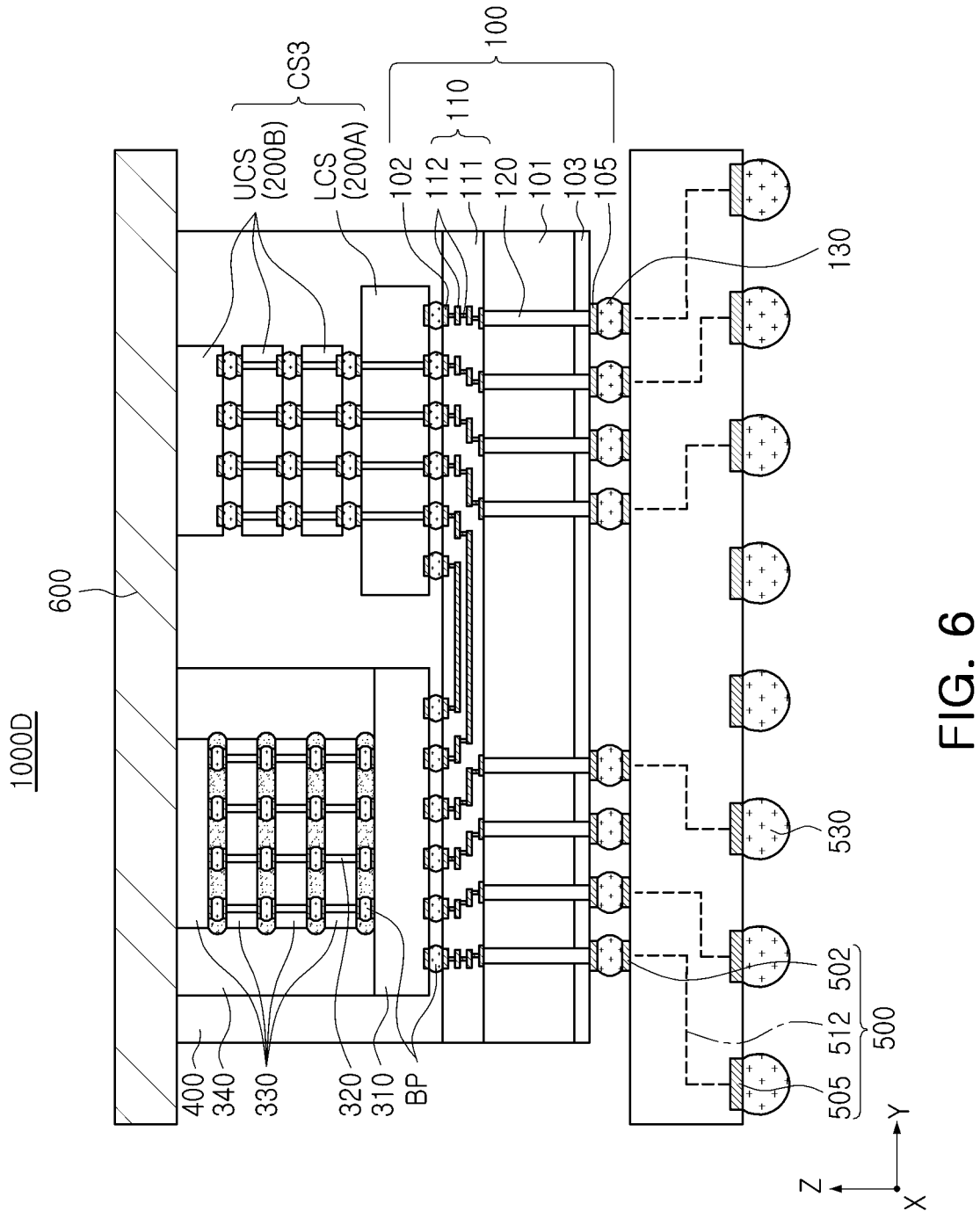
FIG. 6 is a cross-sectional diagram illustrating a semiconductor package according to an example embodiment of the present disclosure.

FIG. 6 is a cross-sectional diagram illustrating a semiconductor package 1000D according to an example embodiment.

Referring to FIG. 6, a semiconductor package 1000D in an example embodiment may be configured the same as or similarly to the example illustrated in FIGS. 1A to 5B other than the configuration in which a heat dissipation structure 600 disposed on the encapsulant 400 may be further included. The heat dissipation structure 600 may be fixed to the encapsulant 400 by an adhesive member, may control warpage of the semiconductor package 1000D, and may release heat generated from the chip structures CS1, CS2, and CS3 to the outside. In example embodiments, the heat dissipation structure 600 may have a shape completely covering the chip structures CS1, CS2, and CS3 and the substrate 100. For example, the heat dissipation structure 600 may have a plate shape in contact with upper surfaces of the chip structures CS1, CS2, and CS3. The heat dissipation structure 600 may include a material having excellent thermal conductivity, for example, aluminum (Al), gold (Au), silver (Ag), copper (Cu), iron (Fe), graphite, and graphene. A thermal interface material (TIM) may be disposed between the heat dissipation structure 600 and the chip structures CS1, CS2, and CS3.

According to the aforementioned example embodiments, by disposing chip structures adjacent to each other in a predetermined shape, a semiconductor package having improved yield may be provided.

While the example embodiments have been illustrated and described above, it will be configured as apparent to those skilled in the art that modifications and variations could be made without departing from the scope of the present disclosure as defined by the appended claims.

What is claimed is:

1. A semiconductor package, comprising:
a substrate;
a first chip structure on the substrate, the first chip structure having a first thickness in a first direction;
a second chip structure on the substrate in adjacent spaced apart relationship with the first chip structure along a second direction that is perpendicular to the first direction, the second chip structure having a second thickness in the first direction;
a third chip structure on the substrate in adjacent spaced apart relationship with the first chip structure and the second chip structure along a third direction that is perpendicular to the second direction; and
an encapsulant covering at least a portion of each of the first chip structure, the second chip structure, and the third chip structure,
wherein the third chip structure comprises:
a lower chip structure having a third thickness in the first direction that is smaller than the first thickness of the first chip structure and the second thickness of the second chip structure, wherein the lower chip structure overlaps a first portion of a space between the first chip structure and the second chip structure in the third direction, and
an upper chip structure on the lower chip structure, wherein the upper chip structure has a fourth thickness in the first direction that is greater than the third thickness of the lower chip structure, and wherein the upper chip structure is configured such that a second portion of the space between the first chip structure and the second chip structure is exposed in the third direction.

2. The semiconductor package of claim 1, wherein an upper surface of the first chip structure, an upper surface of the second chip structure, and an upper surface of the upper chip structure are coplanar.

3. The semiconductor package of claim 1, wherein a sum of the third thickness and the fourth thickness is substantially equal to the first thickness and the second thickness.

4. The semiconductor package of claim 1,
   wherein the lower chip structure comprises a processor circuit, and
   wherein the upper chip structure comprises at least one of an input/output circuit for the processor circuit, an analog circuit, a memory circuit, and serial-parallel converter circuits.

5. The semiconductor package of claim 1,
   wherein the lower chip structure comprises a first semiconductor chip having a first planar area, and
   wherein the upper chip structure comprises a plurality of second semiconductor chips each having a planar area smaller than the first planar area.

6. The semiconductor package of claim 1, wherein an area of the second portion of the space between the first chip structure and the second chip structure in the second direction is greater than an area of the first portion.

7. The semiconductor package of claim 1, wherein the encapsulant is in direct contact with side surfaces of the first chip structure, the second chip structure, and the third chip structure.

8. The semiconductor package of claim 1, wherein the encapsulant is in contact with at least a portion of an upper surface of the lower chip structure.

9. A semiconductor package, comprising:
   a substrate comprising a wiring circuit;
   first and second chip structures on the substrate in adjacent spaced apart relationship along a first direction, wherein the first and second chip structures are electrically connected to the wiring circuit;
   a third chip structure on the substrate in adjacent spaced apart relationship with the first chip structure and the second chip structure along a second direction perpendicular to the first direction, wherein the third chip structure is electrically connected to the wiring circuit;
   an encapsulant covering at least a portion of each of the first chip structure, the second chip structure, and the third chip structure; and
   connection bumps below the substrate and electrically connected to the wiring circuit,
   wherein the third chip structure comprises a lower chip structure that overlaps both the first chip structure and the second chip structure in the second direction, and an upper chip structure on the lower chip structure, wherein the upper chip structure overlaps only one of the first chip structure and the second chip structure in the second direction.

10. The semiconductor package of claim 9, wherein the upper chip structure does not overlap a space between the first chip structure and the second chip structure in the second direction.

11. The semiconductor package of claim 9, further comprising:
   a fourth chip structure on the substrate in adjacent spaced apart relationship with the third chip structure along the first direction.

12. The semiconductor package of claim 11, wherein the fourth chip structure overlaps both the second chip structure and the third chip structure in the first direction, and overlaps only one of the first chip structure and the second chip structure in the second direction.

13. The semiconductor package of claim 9, wherein the first chip structure, the second chip structure, and the third chip structure are electrically connected to each other through the wiring circuit.

14. A semiconductor package, comprising:
   a substrate;
   a first chip structure on the substrate, the first chip structure comprising a first side surface that is spaced apart from one side of the substrate by a first distance;
   a second chip structure on the substrate in adjacent spaced apart relationship with the first chip structure along a first direction, wherein the second chip structure comprises a second side surface that opposes the first side surface of the first chip structure, and wherein the second side surface is spaced apart from the one side of the substrate by a second distance that is greater than the first distance;
   a third chip structure on the substrate in adjacent spaced apart relationship with the first chip structure and the second chip structure along a second direction that is perpendicular to the first direction, wherein the third chip structure comprises a third side surface having a lower side surface spaced apart from the one side of the substrate by a third distance that is less than or equal to the first distance, and an upper side surface spaced apart from the one side of the substrate by a fourth distance that is greater than or equal to the second distance; and
   an encapsulant covering at least a portion of each of the first chip structure, the second chip structure, and the third chip structure.

15. The semiconductor package of claim 14, wherein the lower side surface and the upper side surface have different lengths in the second direction.

16. The semiconductor package of claim 14,
   wherein the third chip structure comprises a lower chip structure defining the lower side surface and an upper chip structure defining the upper side surface, and
   wherein the upper chip structure overlaps the second chip structure in the second direction.

17. The semiconductor package of claim 14, wherein a height of the lower side surface of the third chip structure is less than a thickness of the first chip structure and a thickness of the second chip structure.

18. The semiconductor package of claim 14, further comprising:
   a fourth chip structure on the substrate between the one side of the substrate and the third chip structure,
   wherein the fourth chip structure is spaced apart from the one side of the substrate by a fifth distance that is smaller than the third distance, wherein the fourth chip structure comprises a fourth side surface that opposes the third side surface of the third chip structure.

19. The semiconductor package of claim 18, wherein the fourth side surface of the fourth chip structure has a length that is different from a length of the lower side surface in the second direction and a length of the upper side surface in the second direction.

20. The semiconductor package of claim 14, further comprising a dummy structure on the substrate in adjacent spaced apart relationship with the third chip structure along the first direction, wherein the dummy structure has a thickness that is equal to a thickness of the first chip structure and a thickness of the second chip structure.

\* \* \* \* \*